United States Patent [19]
Hyduke

[11] Patent Number: 5,479,355
[45] Date of Patent: Dec. 26, 1995

[54] SYSTEM AND METHOD FOR A CLOSED LOOP OPERATION OF SCHEMATIC DESIGNS WITH ELECTRICAL HARDWARE

[76] Inventor: Stanley M. Hyduke, 3525 Old Conejo Rd., Newbury Park, Calif. 91320

[21] Appl. No.: 121,926

[22] Filed: Sep. 14, 1993

[51] Int. Cl.$^6$ .................................................. G06F 17/50
[52] U.S. Cl. ............................................ 364/488; 364/578
[58] Field of Search .................................. 364/488, 489, 364/490, 578; 395/500; 371/27, 22.3

[56] References Cited

U.S. PATENT DOCUMENTS

| | | | |
|---|---|---|---|
| 5,051,938 | 9/1991 | Hyduke | 364/578 |
| 5,111,413 | 5/1992 | Lazansky et al. | 364/578 |
| 5,220,512 | 6/1993 | Watkins et al. | 364/489 |
| 5,278,769 | 1/1944 | Bair et al. | 364/490 |
| 5,297,053 | 3/1994 | Pease et al. | 364/488 |
| 5,325,309 | 6/1994 | Halaviati et al. | 364/488 |

*Primary Examiner*—Vincent N. Trans
*Attorney, Agent, or Firm*—David O'Reilly

[57] ABSTRACT

A system and method for a closed loop operation of computer-based designs with external electrical hardware. The system is comprised of a general purpose computer, schematic editor, real-time interactive design simulator, interface circuits and external electrical hardware. The simulator is responsive to the schematic editor and generates signals that are converted by an interface circuit to the signal format demanded by the external electrical hardware. The interface circuit also converts signals produced by the external electrical hardware to be compatible with the simulator format. The above system allows the real-time interactive design simulator and the external electrical hardware to interact with each other in a closed loop.

18 Claims, 6 Drawing Sheets

SYSTEM AND METHOD FOR A CLOSED LOOP OPERATION OF SCHEMATIC DESIGNS WITH ELECTRICAL HARDWARE

BACKGROUND OF THE INVENTION

1. Field of the Invention

The present invention relates to a method and apparatus that allows in-circuit logic emulation, hardware modeling, simulation acceleration and direct industrial process control from schematic designs. The in-circuit logic emulation allows computer-based schematic designs to directly affect the behavior of external electronic hardware and electromechanical devices. Hardware modeling is embedding external hardware devices in computer-based schematic designs and directly affecting their behavior. The simulation acceleration uses actual hardware in place of complex simulated circuits. The industrial process control is similar to the in-circuit emulation, except that the computer-based designs directly control industrial equipment. The invention discloses a unified design environment that allows for direct functional interaction of computer-based designs with electrical hardware.

2. Prior Art

Since testing of a new product design can be very involved, to speed the process, designers are converting their schematics into intermediate hardware that is easy to program and test in conjunction with the target hardware for which the design has been made. Only when the intermediate hardware design has been proven, the design is then produced. A prime example of this approach are products from Quickturn Systems Inc. which allow the designer to convert a schematic design into multiple Xilinx field programmable gate arrays (FPGAs), which can be effectively tested in conjunction with a target hardware. However, such intermediate hardware-based design emulators are very expensive and few can afford it. The programming of such design emulators is cumbersome and takes a significant amount of time. Furthermore, connecting the hardware-based emulators to the target hardware is both error-prone and time consuming.

Another major shortcoming of present design emulators is that their timing may substantially differ from the timing of the design, thus creating wrong test conditions.

Still another problem is that the FPGA devices have unpredictable internal delays and sometimes fail to operate as required by the design. Additional effort is then required to verify that the original schematic design has been properly converted by the emulator.

Since some integrated circuit (IC) models would be too slow to execute, the actual parts are used in place of the IC model. The equipment for feeding output signals from the actual IC devices in place of their models is called "hardware modeling equipment". Many examples of such hardware modeling equipment have been proposed and some have been built.

For example, the method and apparatus disclosed in the U.S. Pat. No. 4,744,084 of Beck, et. al., allow for hardware modeling of ICs of great complexity and speed. However, this patent suffers from the same shortcomings as other similar equipments which attempt to mimic the actual operational environment of the IC device and provide precise timing simulation of the device. As a result, the equipment is burdened with sophisticated clocking circuits for exercising IC devices, and with time shifters to vary the IC output signals within some predetermined range.

The high speed operation of the hardware modelers is achieved by using batch processing. However, this makes the equipment even more costly and thus, less affordable to designers. There are also some other cumbersome restrictions which further complicate the design of the hardware modelers. None of the above restrictions exist in the present invention which is based on a real-time interactive simulator, making the hardware modeling equipment simple and low in cost.

The controllers for industrial applications are highly customized and thus cannot offer the economy of scale. Also, the programming of such controller is often carried out by using specialized computer languages which are expensive, time consuming and difficult to maintain.

The present invention allows for implementation of such industrial controllers by means of computer-based schematic designs. No specialized hardware needs to be built and since the schematic designs can be described with the VHDL hardware description language, therefore the industrial controllers are simple and straightforward.

Since the present art requires a great variety of hardware to be built for various applications, a need exists for a universal, low cost, computer-driven tool and method that would substitute for all this highly specialized hardware. Specifically, a need exists for lower cost and improved design in-circuit emulators, simulation accelerators, hardware modeling equipment and industrial controllers that would minimize these and other problems in the prior art.

BRIEF DESCRIPTION OF THE INVENTION

The purpose of the present invention is to provide simple and easy to use tools for design in-circuit emulation, simulation acceleration, and hardware modeling by handling only the functional behavior of the designs and IC models. Furthermore, design in-circuit emulators, simulation accelerators, hardware modeling and process control are provided by the same tool and software process.

The present invention allows for handling a greater variety of designs which cannot otherwise be accommodated by using any of the existing in-circuit emulators or hardware modeling tools. This invention provides a universal design tool that is based on a proprietary software design and generally available electronic hardware. The cost of the tools is thus lower and allows the handling of unrestricted voltage levels, currents, number of input/output (I/O) channels to name a few.

All commercially available design emulators handle exclusively logic designs. However, most electronic designs include a mixture of digital and analog circuits which are entered as one object of this invention and provide a uniform design emulation technology that will accommodate both analog and digital circuits.

Often only a small section of electronic hardware requires correction. If a present art emulator is used to test the problem, then the entire design must be converted into intermediate hardware and tested independently of the hardware breadboard. It is thus another object of this invention to allow a flexible emulation of selected design sections that can be fed directly into a hardware breadboard that represents the remaining sections of the design.

The present art also requires that hardware-based emulators produce signals directly compatible with the target hardware. This places an extra burden on the emulated design and makes it prohibitively expensive. Another object of the present invention, is to eliminate this problem by using a combination of proprietary software and commonly available general purpose hardware that can accommodate any voltage and current requirements imposed by target hardware. All commercially available simulation accelerators are based on proprietary hardware and software and are thus very expensive. Furthermore, because of the lengthy software compilations they are not suited for interactive design analysis. It is thus an object of this invention to provide a tool and method for converting selective design sections into programmable hardware to accelerate the overall simulation process. A design environment in which some design sections are in the form of programmable hardware while the other design sections remain in the schematic form, is fast and conductive to incremental design and analysis.

Another important object of the present invention is to resolve the urgent need to provide a more general, integrated, easier to use and less costly design emulation, simulation acceleration and hardware modeling tools.

The present invention, through a unique program, eliminates the need for intermediate hardware and provides a means and a method of directly applying the design simulator produced signals to the target hardware. Also, the target hardware produced signals can be directly applied to the design simulator, thus both the design simulator and the target hardware may operate with each other in a closed loop.

The following definitions and terms are used to describe the method and apparatus of the present invention:

Schematic Editor—Any graphical editor which allows graphical presentation of design content through the use of blocks, icons and lines connecting these items to show their interdependency.

Schematic Design—Any graphical design representation produced under the schematic editor. It may include symbols representing actual hardware devices, blocks described by hardware description language (HDL) statements, and similar.

Design Netlist—A netlist is an alpha-numeric design representation which lists devices and their interconnections.

Design Simulator—A program or software subroutine responsive either to schematic design entry or design netlist and a set of design stimuli signals. It creates in the computer memory an operational model of the design subjected to the design stimuli signals. The simulator used by the present invention is real-time interactive and does not require any schematic compilations to calculate the effect of stimuli signals on the schematic design.

Hardware Modeler—In the present art it is specialized hardware that substitutes an actual hardware for the IC model shown in the schematic design. According to the present invention, it is a program subroutine and a set of standard hardware that control the flow of data between the design simulator and the target hardware.

Design Emulator—As known in the present art, it is specialized hardware that substitutes for the schematic design or netlist and is used in conjunction with the target hardware. It is commonly referred to as "in-circuit emulation". According to the present invention, it is a program subroutine and a set of standard hardware that control the flow of data between the design simulator and the target hardware to provide the in-circuit emulation.

Simulation Cycle—A time period used for processing of a single test vector.

Target Hardware—Electrical hardware that is used to control selected equipment and is to be interfaced with the emulated design.

Test Vector—A set of stimuli signals applied to the schematic design at any selected instant in time. Each change in the design signal stimuli is considered a test vector.

The design in-circuit emulation, according to this invention, is implemented with the aide of a computer and resident software program subroutine. The system includes a design simulator, schematic editor, data entry device, schematic and simulator display and input/output (I/O) control subroutine. The schematic editor feeds the design data directly into the design simulator through signal lines.

A design simulator is an electronic breadboard comprised of entries received from the schematic editor and residing in the random access memory (RAM) of the computer. The design simulator mimics the operation of hardware built according to the schematic design. The design simulator instantly responds to each entry from the schematic editor and creates a corresponding design entry in its own internal data tables that reside in RAM.

Data is entered through a keyboard, mouse device, digital, track ball or any combination thereof. The data entry device is used to enter design data into the schematic editor via signal lines and for selecting simulator test and display conditions. A data input device also controls the set-up of an I/O control program subroutine which controls the flow of data in/out of the design simulator. Through the use of the data input device and associate program subroutines, the designer assigns test points within the design simulator that will be stimulated by outputs from the target hardware. Similarly, the designer is able to assign to the I/O subroutine selected design simulation outputs that will be applied to the target hardware.

The input signal converter feeds the target hardware generated outputs to the design simulator. The design simulator can also trigger the I/O program subroutine to perform data transfer from memory locations to the appropriate channels within the output signal converter. The output signal converter provides data to the target hardware through a plurality of lines. This data transfer is triggered by a completion of a simulation cycle.

Any time the input signal converter generates an interrupt, the I/O program subroutine responds by transferring data from the input signal converter to the associated RAM locations. Following the data transfer, a program subroutine checks if there are any changes between the newly loaded signals and the old data at the same memory locations. If there are no changes, there is no action taken by the simulator, and the program subroutine waits for a new interrupt.

However, if the new data is different from the previous data, then the subroutine will activate operation of the design simulator on the new data transferred to the above described RAM memory locations. A subroutine then monitors the simulator outputs to see if they have achieved a steady state. When the outputs have achieved a steady state, another subroutine triggers the operation of a data transfer subroutine to the output converter. In this matter, the I/O program subroutine simulates the interaction of the schematic design with the target hardware.

The above, and other novel features and advantages of this invention will be more fully understood from the following detailed description and accompanying drawings in which:

DETAILED DESCRIPTION OF THE INVENTION

Figure 1:
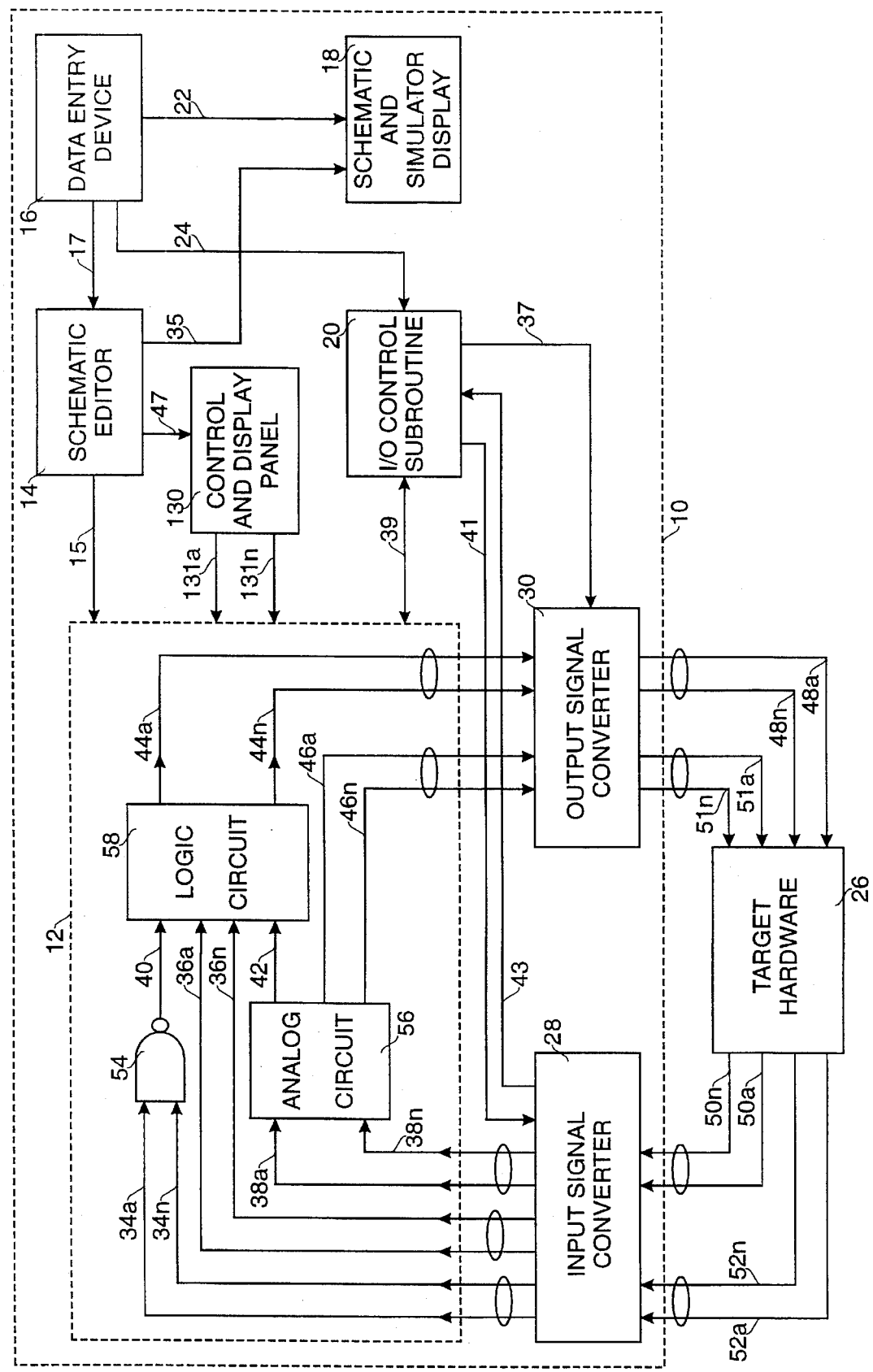
FIG. 1 is an overall schematic block diagram of a design emulation circuit according to the invention.

Referring to FIG. 1, a system and method is shown comprised of a general purpose computer 10 (such as an IBM PC compatible computer) that implements design emulation with the aid of resident program software subroutines. The system includes the design simulator 12, schematic editor 14, and data entry device 16, display 18 for displaying schematic and simulated data, and an input/output (I/O) control program subroutine 20. Schematic editor 14 can be similar to that known by the Trademark of ACTIVE-CAD from Aldec Inc. of Newbury Park, Calif. Schematic editor 14 feeds design data through signal lines 15 directly into the design simulator 12. Schematic editor 14 is not mandatory because some design simulators, such as SUSIE 6.0 manufactured by Aldec Inc. of Newbury Park, Calif., can work directly off of schematic netlists which are sufficient for proper operation of the invention disclosed herein.

Figure 2:
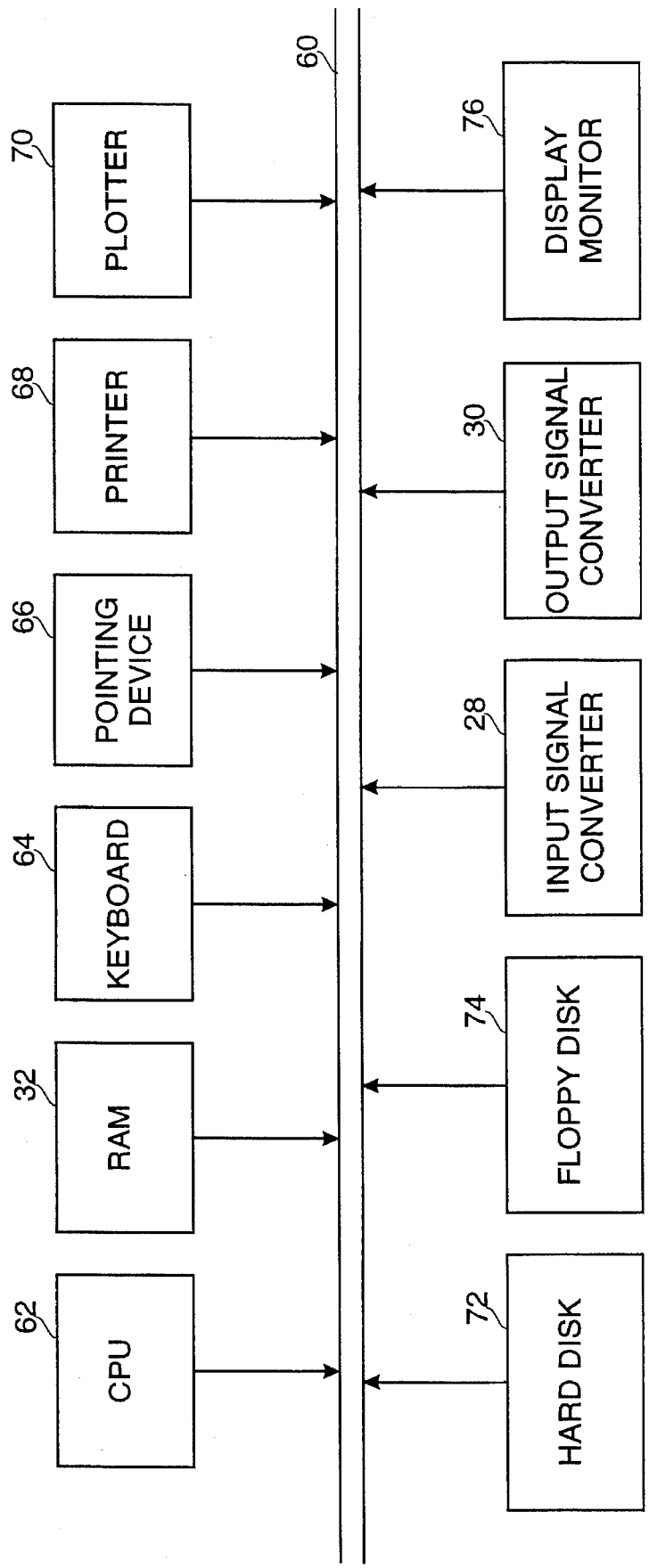
FIG. 2 is a block diagram of the system component illustrating the data transfer.

Design simulator 12 is an electronic breadboard of entries from schematic editor 14 that reside in Random Access Memory (RAM) 32 (FIG. 2). Design simulator 12 mimics the operation of hardware that could be built according to the entries from the schematic editor 14. The art of design simulators is well known and the enclosed invention has been conceived based on the ACTIVE-CAD resident simulator referred to herein above. This simulator responds virtually instantly through signal lines 15 to each entry from schematic editor 14, and creates a corresponding design entry in its own internal data tables that reside within RAM 32.

Design simulator 12 is similar to the devices in U.S. Pat. Nos. 4,827,427 and 5,051,938 by the same inventor as the system disclosed and incorporated by reference. This design simulator 12 operates on design data tables, and there is no need to compile the test vectors with the schematic design. As a result, the simulator 12 can quickly respond to any new test vector applied to the electronic breadboard, stored in RAM 32. Because of its compilation free response to test vectors, the design simulator 12 is commonly called the real-time interactive simulator.

Data entry device 16 may be a keyboard, mouse device, digitizer, track ball, or any combination thereof. Data entry device 16 is used for entering designs into schematic editor 14 via signal lines 17. Data entry device 16 also controls via signal lines 22 the schematic and simulator display 18 for selective viewing of their setups, test points, timing waveforms, and similar. Data entry device 16 also controls, through signal lines 24, the set-up of I/O control program subroutine 20 which controls, through signal line 39, the flow of data in and out of design simulator 12. Through the use of data entry device 16 and the associated "control program subroutine 20," the designer selects test points within design simulator 12 that will be stimulated by outputs from target hardware 26. Similarly, the designer is able to assign to the control program subroutine 20 selected outputs from the design simulator 12 that will be output to target hardware 26.

Schematic and simulator display 18 is preferably a cathode ray tube (CRT) display or liquid crystal (LCD) display. However, other data and graphic displays could also be used. Schematic and simulator display 18 preferably displays both the schematic and simulation data and is used to facilitate the set-up of design simulator 12. For example, the designer can point with a mouse device to a selected device pin or signal line visible on the schematic and simulator display 18 and select it for either feeding into target hardware 26 or receiving signals directly from target hardware 26. All such signal selections are fed into the I/O control program subroutine 20 through the signal lines 24.

Schematic editor 14 resides in RAM 32 and allows for design entry. Schematic editor 14 is closely integrated with the design simulator 12 and all schematic entries are quickly entered into the simulator. The art of schematic entry is well established and may involve entry and display of interconnecting blocks and icons representing gates, counters, and other hardware devices. The aforementioned blocks and icons may also be "black boxes" described by "VHDL" programs, Boolean equations, state machine description, timing diagrams and other means of design behavior description.

Input signal converter 28 and output signal converters 30, in conjunction with the I/O control program subroutine 20, will provide the selected signal lines with data from or to the target hardware 26 respectively. For example, if signal lines 34a–n, 36a–n (called the input test vectors) have been selected by data entry device 16 to be controlled by outputs from the target hardware 26, then signal converter 28 will produce new data on these signal lines when its internal timer causes an interrupt. The designation a–n, where n can be any number, indicates that there are a number of signals or lines to and from target hardware 26 and signal converters 28 and 30 respectively. Following typical procedures, input signal converter 28 can also monitor signal lines 50a–n and 52a–n and generate an interrupt in response to any change on these signal lines. The input test vectors produced by input signal converter 28, on output signal lines 34 and 36, are automatically loaded into appropriate locations in RAM 32, under the control of interrupt invoked control program subroutine 20 via signal line 43, and they start a new operation in design simulator 12.

The signal lines located within the computer 10 and depicted in FIG. 1, are provided for displaying the data flow only. The actual signals are transferred by the computer 10 internal signal data buses, which architecture depends upon the computer design. The computer 10 internal data buses are represented by the bus signal lines 60 and all data transfers on these signal lines are under the control of the simulator 12 software subroutines hardware modeling subroutine 118 and I/O control subroutine 20.

Design simulator 12 responds to any changes on input signal lines 34 and 36 and processes the design response to these input test vector changes. The response is presented on its signal lines 40, 42 and 44a–n. Design simulator 12 also triggers I/O control program subroutine 20 to perform data transfer from memory locations represented by lines 44a–n and 46a–n, to the appropriate channels within the output signal converter 30. Triggering of the I/O control program subroutine 20, by design simulator 12, is described in reference to FIG. 3.

Output signal converter 30 stores the data provided by the program subroutine 20 and provides it directly to the target hardware 26 through lines 48a–n.

RAM 32 (FIG. 2) stores every signal, logical or analog state in the entire design, at some discrete memory locations. For example, memory locations store the logical or analog value of the signals on lines 34, 36, 38, 44 and 46 respectively. I/O control program subroutine 20 can permanently override these memory location-based signals, which are normally generated by design simulator 12, with outputs from the target hardware 26.

Figure 3:
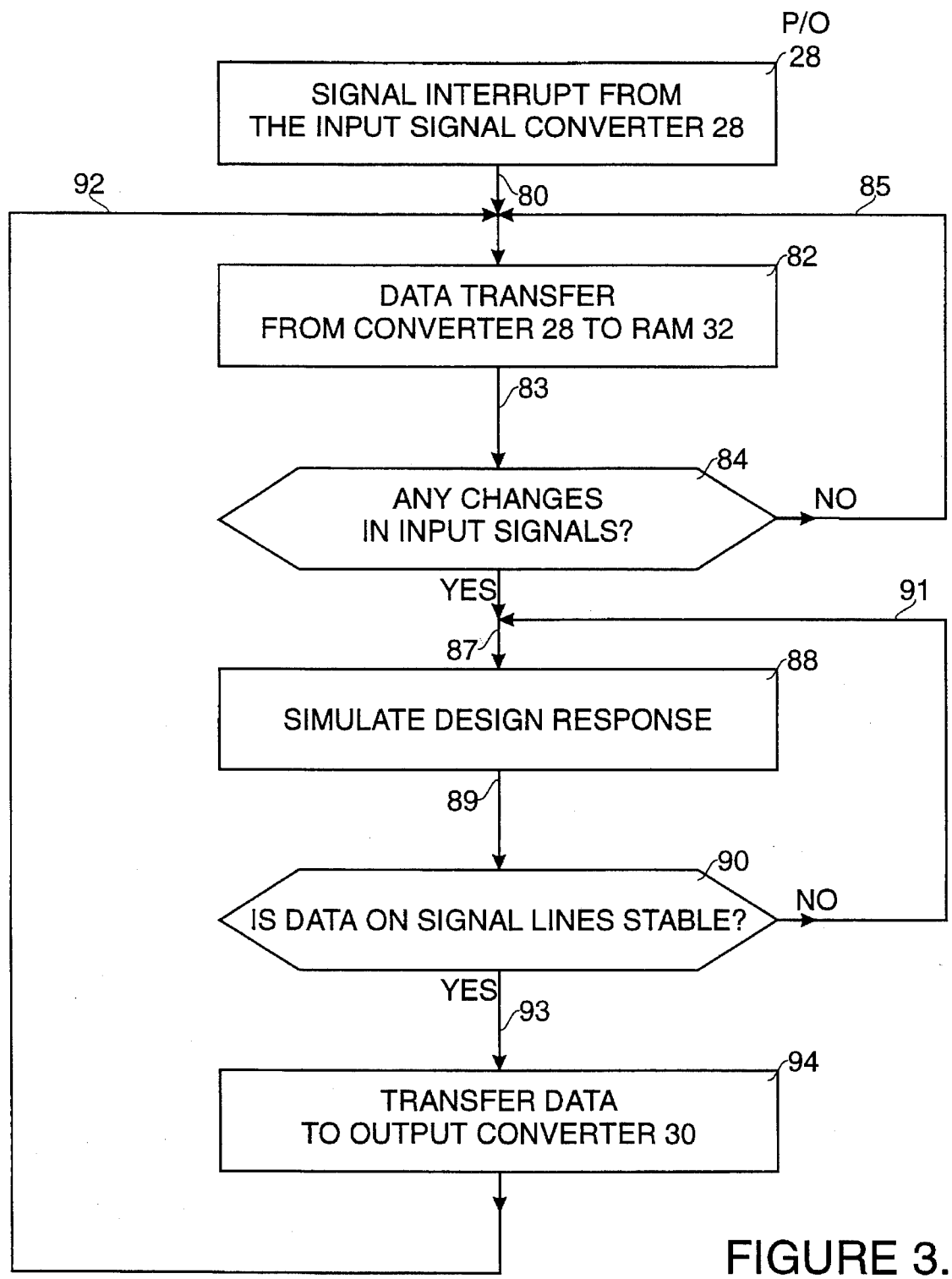
FIG. 3 is a flow chart of an I/O control program subroutine according to the invention.

The operation of I/O control subroutine 20 and the emulation process can be better understood by reference to FIG. 3. Anytime input signal converter 28 generates an interrupt on line 80, I/O control program subroutine 20 responds by transferring data from input signal converter 28, which are called test vectors, to the associated locations in RAM 32, indicated by data transfer subroutine 82. Following data transfer, input signal changes subroutine 84 checks if there are any changes between the newly loaded test vectors and the old data at the same memory locations. If there are no changes, there is no action taken by design simulator 12. Otherwise, design simulator 12 simulates the new test vectors under control of simulate design response subroutine 88.

Stable data subroutine 90, operating under control of the signal line 89, from simulator design response subroutine 88, monitors if the design simulator 12 outputs have achieved a stable state. When these outputs have achieved a steady state, stable data subroutine 90 triggers through signal line 93, operation of the data transfer subroutine 94. Data transfer subroutine 94 transfers the data from selected signal lines 44 and 46 to output signal converter 30. Following this, data transfer subroutine 94 transfers control via signal line 92 to data transfer subroutine 82.

Figure 4:
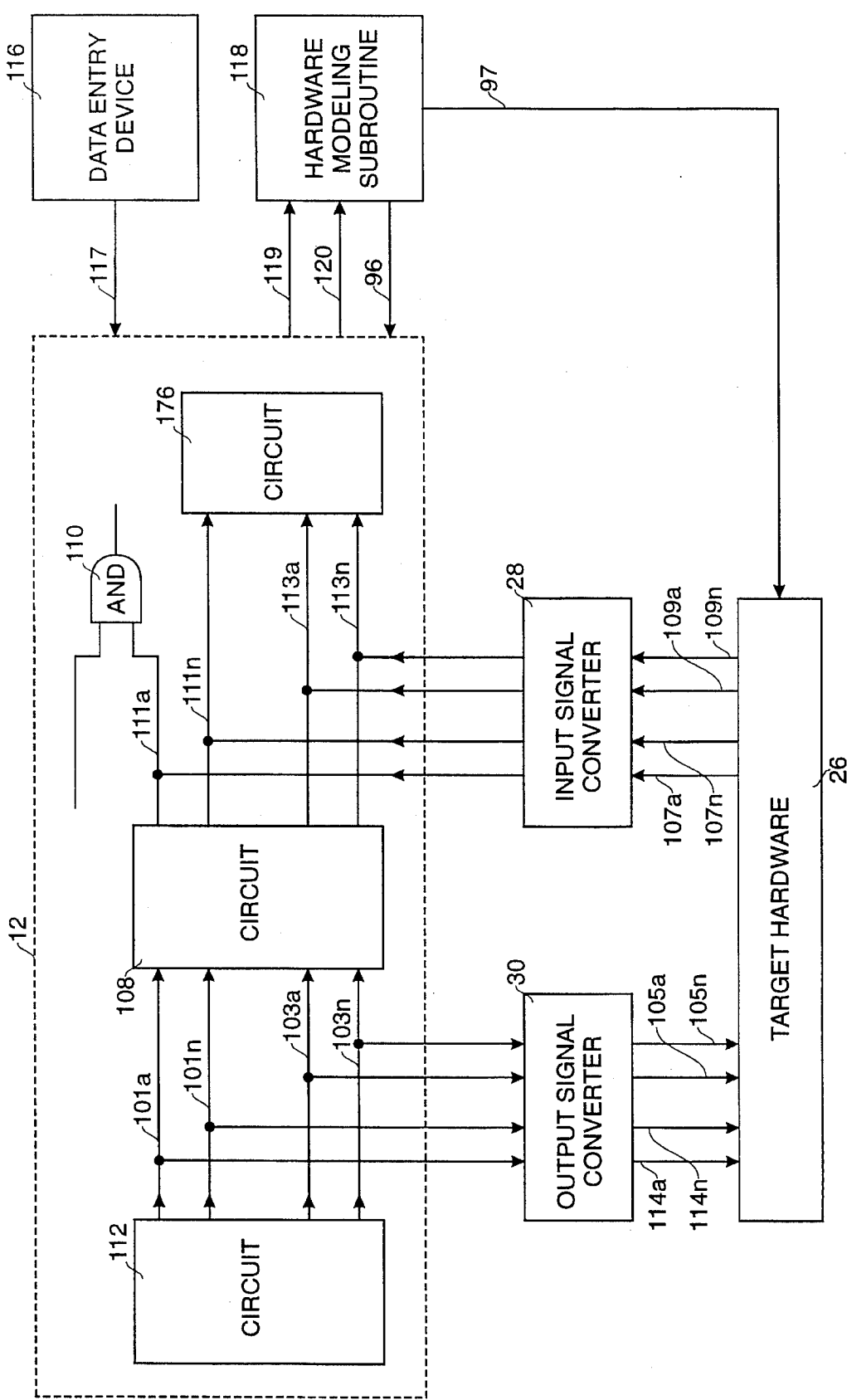
FIG. 4 is a schematic block diagram of the hardware modeling equipment.

The system described with reference to FIGS. 1 through 3 can also be used for hardware modeling and simulation acceleration. A typical arrangement for hardware modeling of IC models is illustrated in FIG. 4. Target hardware 26 represents an actual IC device whose outputs will be used in place of outputs from the logic circuit 108, shown in FIG. 4. Input signals 101a–n and 103a–n which are applied to the circuit 108 are fed via output signal converter 30 to input 114a–n and 105a–n of the target hardware 26. Since target hardware 26 is an actual hardware of circuit 108, their input signal pins have identical functional meanings. Specifically, signal lines 103a–n and 105a–n may represent analog signals. In response to input signals 114a–n and 105a–n, target hardware 26 produced signals, on its output signal lines 107a–n and 109a–n, are fed under control of the I/O control program subroutine 20 and input signal converter 28 into the circuit 108 output lines.

The signals generated by target hardware 26 take control of signal lines 111a–n and 113a–n and provide the same functional behavior as circuit 108 would provide, should it be in control of these signals lines. For example, the AND gate 110 will respond through signal line 111a to the signal on line 107a, being under control of target hardware 26.

Since the actual hardware operates over million times faster than its computer model, it is thus possible to accelerate the design simulation by converting some of its sections into target hardware 26. The use of hardware modeling process for design simulation acceleration is described in reference in FIGS. 4 and 7. The designer, acting through data entry device 116 and signal lines 117, can for example select design section 108 for conversion into the actual hardware. Design section 108 is one of multiple electronic circuits within simulator 12. Responding to the designer's request on signal 117, design simulator 12 disables section 108 from simulation and triggers hardware modeling subroutine 118 through signal line 119.

Figure 7:
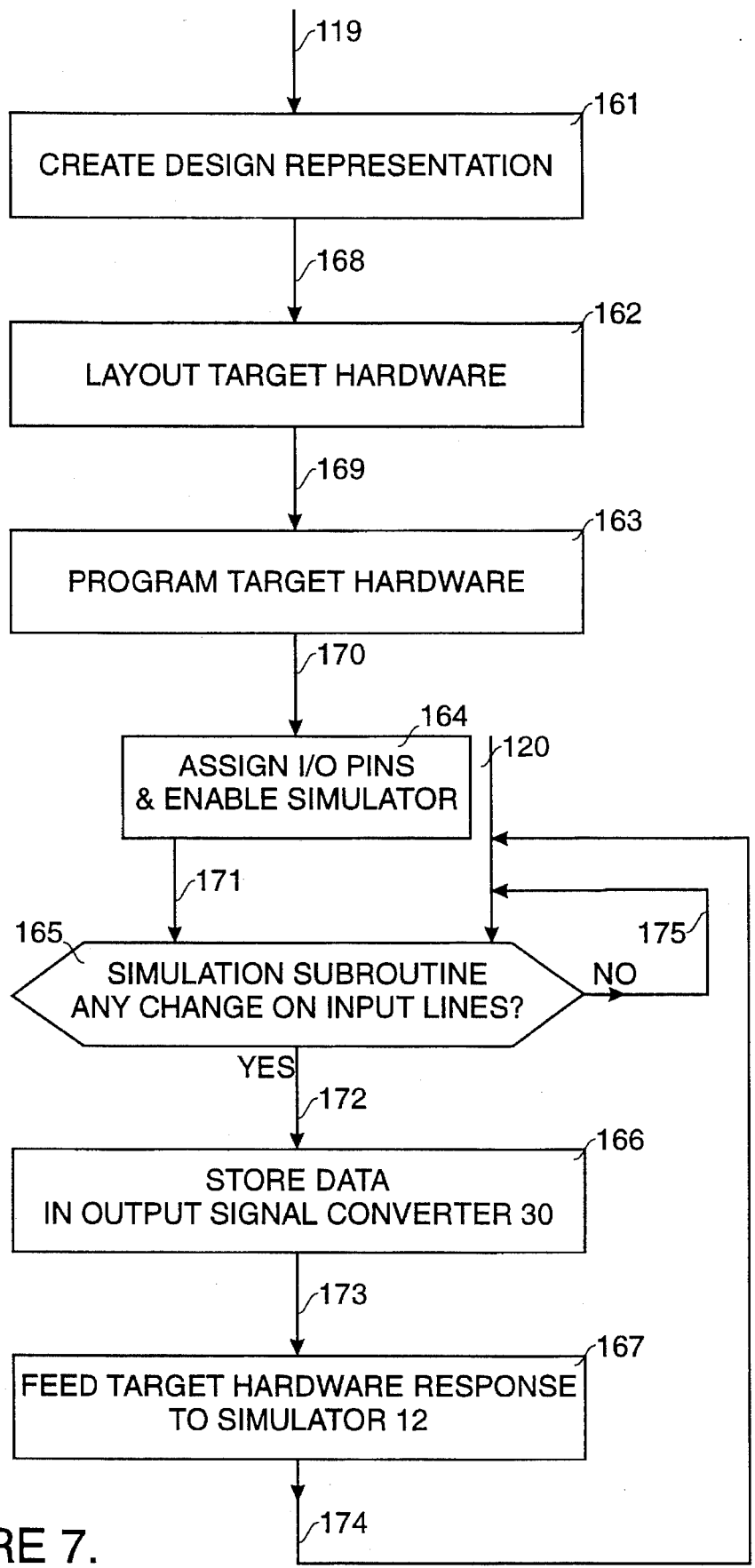
FIG. 7 is a flow chart of a simulation acceleration subroutine according to the invention.

FIG. 7 shows software subroutine 118 that converts selected design section 108 into target hardware 26. Responsive to signal lines 119, subroutine 161 assembles all necessary data for conversion of the selected design section 108 into target hardware 26. For example, this data can be a netlist or a set of data tables referenced by pointers, which represent the operation of design section 108. Subroutine 162 responds to design section 108 representation provided on signal line 168 and produces a layout of target hardware 26, which can be any programmable device, including an FPGA device. A typical example of such subroutine 162 would be XACT software product from Xilinx Inc. of San Jose, Calif., which allows for layout of many popular FPGA devices such as XC3190.

The layout data is fed into target hardware 26 under the control of subroutine 163, which is receiving the layout data on signal line 169. In case of some FPGAs, the target hardware 26 layout could be as simple as loading a dedicated RAM device. Subroutine 164 assigns input and output pins of design section 108 to concrete target hardware 26 pins, which are usually assigned by layout subroutine 162. Upon completion of the pin assignment, subroutine 164 triggers simulation subroutine 165 via signal line 171.

Subroutine 165, which is responsive to signal line 120, monitors if there has been any change on signal line 101a–n and 103a–n, on the input to selected design section 108. If any of the signal lines 101a–n and 103a–n has been subject to a change, the subroutine 166 stores its new data in output signal driver 30, which directly controls target hardware 26 via signal lines 105a–n and 114a–n. Target hardware 26 response provided on signal lines 107a–n and 109a–n is fed into simulator 12 via input signal converter 28 and signal lines 111a–n and 113a–n. Acting upon the data provided on signal lines 111a–n and 113a–n, design simulator 12 simulates their affect on other design sections, including circuits 110 and 176.

Since the simulation accelerator is implemented by means of target hardware 26, which preferably resides within computer 10, input signal conversion within converter 28 may not be needed, and signal lines 107a–n and 109a–n may feed directly into simulator 12 over computer bus 60. The use of FPGA devices as target hardware 26 for simulation acceleration was provided as an example. Target hardware 26 can also be a special purpose high speed processor, processor network and other forms of programmable hardware.

Conventional computer hardware 10 is comprised of all the necessary means for program entry, display, execution, and storage as shown in FIG. 2. A typical example of such a computer is a personal computer QSYS-486-DX which may include a CPU 62, RAM 32, keyboard 64, pointing device 66, printer 68, plotter 70, hard disk storage 72, floppy disk storage 74 and display monitor 76 which can be a CRT or an LCD display. In addition, computer 10 is equipped with an input signal converter 28 and output signal converter 30; both preferably located on one easily reconfigurable board.

Input and output signal converters 28 and 30, respectively are preferably similar to the CYOPTO 48 or CYDIO 192T products from Cyber Research of Branford, Conn. There are many other manufacturers of similar products, including National Instruments, Data Translation and Industrial Computer Source.

In addition to the aforementioned hardware and application software program, computer 10 of FIG. 2 also includes an operating system stored in RAM 32 and hard disk 72. The operating system can be DOS, Windows, UNIX or any other operating system that suits the selected computer hardware and schematic editor 14 as well as design simulator 12. Since the art of computer design is well established, no details of conventional computer 10 (internal architecture or operation) are provided beyond FIG. 2 which depicts the essential hardware required for the invention disclosed.

Input signal converter 28 and output signal converter 30 are capable of handling both digital and analog signals. Signal lines 34 and 36 represent single bit digital data transfers. Signal lines 38*a–n* represent analog signals on the output of an A/D converter, which is located within the input signal converter 28, and typically each of these lines represents 8 to 16 bit data paths. Signal lines 34, 36, 38, 44 and 46 are provided to demonstrate the flow of signal data. Physically, these data transfers are implemented through standard computer protocols over signal bus 60 (FIG. 2). No special signal lines need to be added to conventional computer 10 hardware to implement the above data transfers.

Input signal converter 28 accepts signals generated by target hardware 26 and converts them to a format suitable for transfer on computer 10 internal signal bus 60. For example, input signal converter 28 produces zero volts for a zero logic signal state and +5 volts for a one logic signal state. Should the target hardware 26 produce +12 volts for logic one signal state or 60 mA current for logic zero signal state, the converter 26 will convert these voltages and current to the voltage levels required by the computer 10. Output signal converter 30 converts signals provided on lines 44*a–n* and 46*a–n* from their internal voltage levels to the voltage and current levels demanded by target hardware 26. For example, the +5 volts for logic one signal state may be converted by converter 30 to +12 volts, if demanded so by target hardware 26.

Converters 28 and 30 may also convert analog signals. For example, output signal converter 30 may convert, analog signals, represented by binary signals of 0 Volts and +5 Volts, to current levels 0 mA and 20 mA, or between −6 Volts and +6 Volts. Similarly, input signal converter 28 may convert low voltage analog signals, being 0 mVolts and 50 mVolts, from the service sensor 122, to the 0 Volts to +5 Volts signal logic levels, demanded by computer 10.

Design simulator 12 is a mixed-mode analog-digital simulator. Analog circuit 56 can be comprised of diodes, resistors, transistors, and operational amplifiers as well as other analog devices. Analog circuit 56 responds with a transient response on its output signal lines. Design simulator 12 produces on signal lines 46*a–n* digital signals that represent analog signal values. These digital signals are then converted into analog signals by D/A converters, located within output signal converter 30. The converted analog signals are provided to the target hardware 26 on signal lines 51*a–n*.

Figure 5:
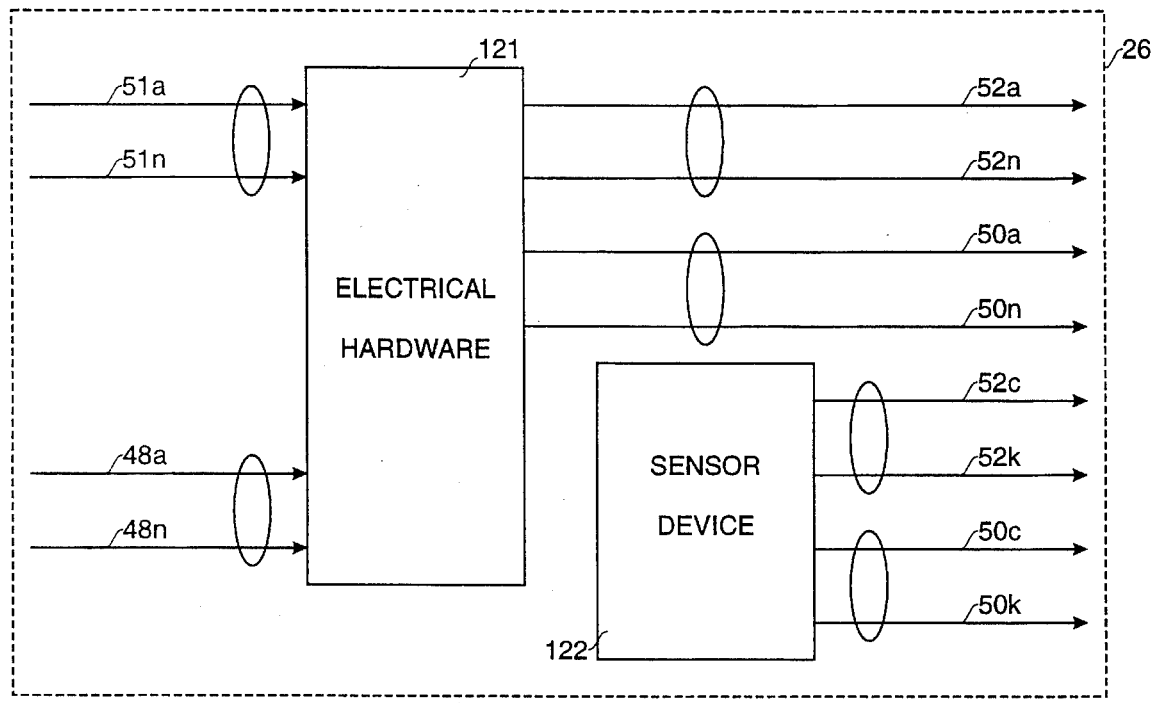
FIG. 5 is a block diagram of an industrial process control hardware.

The circuit arrangement shown in FIG. 1. can also be used to provide low cost industrial controllers which use off-the-shelf personal computers and I/O controller boards. FIG. 5 shows details of the target hardware 26 for industrial applications. Design simulator 12 controls the electrical hardware 121 through signal lines 51*a–n* and 48*a–n*, described in reference to FIG. 1. The electrical hardware 121 can be DC motors, stepper motors, solenoids, relays and other devices and electrical actuators.

The industrial target hardware 26 includes some sensor devices 122, such as temperature, oil pressure, limit switches, humidity sensors, and similar. The sensor device outputs, provided on signal lines 52*c–k*, are part of the signal lines designated as 52*a–n*, shown in FIG. 1. The design simulator 12 processes the signals on lines 52*c–k* the same way as any other signal on signal lines 52*a–n*. Similarly, analog signals 50*a–n* from target hardware 26 may include some analog signals 50*c–k*, which are generated by sensor device 122.

Figure 6:
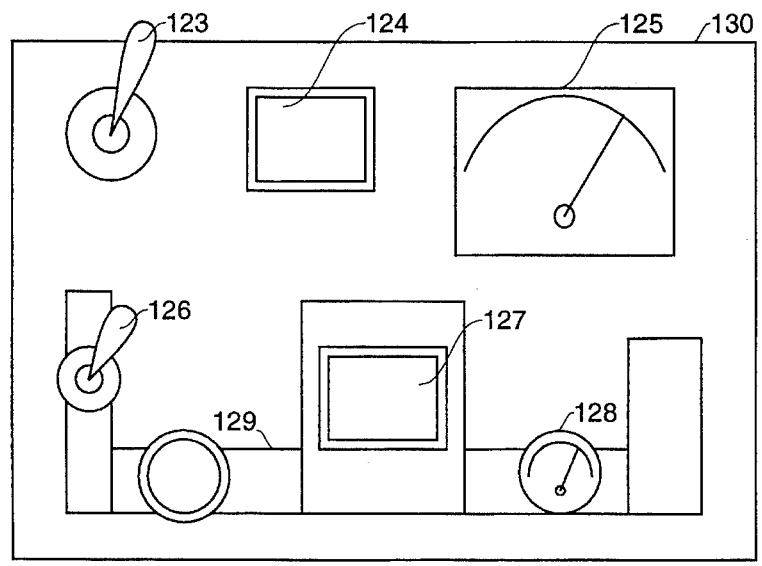
FIG. 6 is an illustration of an industrial control panel.

To further facilitate the industrial process control, schematic editor 14 allows for creating and displaying an industrial control panel 130 (FIG. 6), comprised of active icons representing control devices and passive icons representing sensor devices. The active icons are shown in FIG. 6 as switches 123 and 126. Any operation on active icons 123 and 126 is equivalent to operation on the schematic design 14 and produces a signal on signal lines 131*a–n* that affects the design simulator 12 (FIG. 1). The signal lines 131*a–n* have a similar affect on the design simulator 12 as the signal lines 15. Control and display panel 130 is preferably displayed on schematic and simulator display 18.

The passive icons are represented by lamps 124 and 127 and instruments 125 and 128, showing the status of target hardware 26. Active icons 123 and 126 allow the operator to act upon the design simulator 12 and thus affect target hardware 26. The passive icons represent signals provided by the target hardware 26 and which may affect the design simulator. However, the operator cannot cause any design simulator 12 action by acting upon the passive icons 124, 125, 127, and 128.

The passive icons are stimulated by the signals from target hardware 26, provided via input signal converter 28 and associated signal lines 34*a–n*, 36*a–n* and 38*a–n*.

The icon-based devices may be shown individually, as depicted by 123, 124 and 125, and as a part of an industrial process flow 129, represented by icons 126, 127 and 128.

Schematic editor 14 has all the necessary means to effectively create nested control panels 130. However, since these details are known to all skilled in the art, no special disclosure is provided.

Thus, there has been disclosed, a novel system and method for direct debugging of schematic designs in conjunction with target electrical hardware that facilitates in-circuit emulation, design acceleration and hardware modeling. Furthermore, it has been disclosed how computer-based designs can operate in a closed loop with industrial electrical equipment and devices.

It is apparent to those skilled in the art that the invention can be used for functional board testing, integrated circuit performance analysis, and similar. There can be numerous enhancements to the described hardware, like the I/O converter boards 28 and 30 can include digital signal processors (DSPs), RISC processors, and other highly specialized devices to fulfill the specific application needs. Also, the routing of signals between the design simulator 12, schematic editor 14, control panel 130 and other system elements can have many enhancements to speed the data transfer. There can also be numerous improvements in schematic editor 14, mixed mode design simulator 12 and computer means 10, which all fall within the scope of this invention.

This invention is not to be limited by the embodiment shown in the drawings and described in the description which is given by way of example and not of limitation, but only in accordance with the scope of the appended claims.

What is claimed is:

1. A system for direct control of electrical hardware by computer-based circuit designs comprising; computer means;
   real-time interactive design simulation means in said computer means which simulate multiple electronic circuits;
   entry means for entering circuit design data into said real-time interactive design simulation means;
   output signal converting means for receiving and converting signals from said real-time interactive design simulation means, said output signal converting means including storage means;
   target hardware means connected to said output signal converting means;
   input signal means receiving input signals from said target hardware, said input signal means generating an interrupt in response to any change in said input signals;
   input/output control program means for controlling transfer of simulation signals between said real-time interactive design simulation means, said output signal converting means and said input signal means;
   said output signal converting means converting and applying simulation signals received from said real-time interactive design simulation means to target hardware means, said target hardware means being virtually instantly responsive to signals from said output signal converting means.

2. The system according to claim 1 in which said target hardware means produces test vector signals in response to signals from said output signal converting means, said input signal means receiving and converting said test vector signals; said input/output control program means controlling transfer of said test vector signals from said input signal converting means to said real-time interactive design simulation means; said real-time interactive design simulation means producing simulation signals in response to each of said test vector signals received from said input signal converting means.

3. The system according to claim 2 in which said target hardware means includes sensor devices.

4. The system according to claim 2 including design representation means, target hardware layout means and target hardware programming means; said real-time interactive simulation means having means for deselecting an electronic circuit from said simulated multiple electronic circuits; said design representation means responsive to said deselected electronic circuit and producing an electronic representation of the deselected electronic circuit;
   said target hardware being programmable hardware means;
   said target hardware layout means converting said electronic representation of the said deselected electronic circuit into layout data for said programmable hardware means;
   said target hardware programming means programming said programmable hardware means.

5. The system according to claim 1 in which said entry means includes; schematic editor means; display means; said schematic editor means applying circuit design entries to said design simulation means for simulation; said display means receiving and displaying said circuit design entries.

6. The system according to claim 5 in which said output converting means include means for converting signals to the electrical format required by said target hardware means.

7. The system according to claim 5 wherein said display means display said test vector signals.

8. The system according to claim 7 in which said target hardware means includes sensor devices.

9. The system according to claim 5 including a control panel and active icons, wherein; said schematic editor and display means allow for creating control panels, said control panels having active icons and operations on said active icons affect the real-time interactive design simulation means.

10. The system according to claim 9 in which said target hardware means are responsive to operations on said active icons located on said control panel.

11. The system according to claim 9 including passive icons, wherein; said control panel includes passive icons responsive to signals provided by said target hardware means.

12. A system for direct control of electrical hardware by computer-based circuit designs comprising;
    computer means;
    real-time interactive design simulation means in said computer means which simulate multiple electronic circuits
    entry means for entering circuit design data into said real-time interactive design simulation means;
    output signal converting means for receiving and converting signals from said real-time interactive design simulation means, said output signal converting means including storage means;
    target hardware means connected to said output signal converting means;
    input/output control program means for controlling and synchronizing transfer of simulation signals between said real-time interactive design simulation means and said output signal converting means;
    said output signal converting means converting and applying simulation signals received from said real-time interactive design simulation means to target hardware means, said target hardware means being virtually instantly responsive to signals from said output signal converting means.

13. The system according to claim 12 including design representation means, target hardware layout means and target hardware programming means; said real-time interactive simulation means having means for deselecting an electronic circuit from said simulated multiple electronic circuits; said design representation means responsive to said deselected electronic circuit and producing an electronic representation of the deselected electronic circuit;
    said target hardware being programmable hardware means;
    said target hardware layout means converting said electronic representation of the said deselected electronic circuit into layout data for said programmable hardware means;
    said target hardware programming means programming said programmable hardware means.

14. The system according to claim 12 in which said entry means includes; schematic editor means; display means; said schematic editor means applying circuit design entries to said design simulation means for simulation; said display means receiving and displaying said circuit design entries.

15. The system according to claim 14 in which said output converting means include means for converting signals to the electrical format required by said target hardware means.

16. The system according to claim 14 including a control panel and active icons, wherein; said schematic editor and display means allow for creating control panels, said control panels having active icons and operations on said active icons affect the real-time interactive design simulation means.

17. The system according to claim 16 in which said target hardware means are responsive to operations on said active icons located on said control panel.

18. The system according to claim 16 including passive icons, wherein; said control panel includes passive icons responsive to signals provided by said target hardware means.

* * * * *